United States Patent [19]

Matsuda et al.

[11] 4,216,491

[45] Aug. 5, 1980

[54] SEMICONDUCTOR INTEGRATED CIRCUIT ISOLATED THROUGH DIELECTRIC MATERIAL

[75] Inventors: Takashi Matsuda; Kazuo Niwa; Yasusuke Sumitomo, all of Yokohama, Japan

[73] Assignee: Tokyo Shibaura Electric Co., Ltd., Kawasaki, Japan

[21] Appl. No.: 938,511

[22] Filed: Aug. 31, 1978

Related U.S. Application Data

[63] Continuation of Ser. No. 732,544, Oct. 14, 1976, abandoned.

[30] Foreign Application Priority Data

Oct. 15, 1975 [JP] Japan .................................. 50-124030

[51] Int. Cl.² .................... H01L 27/12; H01L 29/72; H01L 29/46
[52] U.S. Cl. ...................................... 357/49; 357/34; 357/67; 357/71
[58] Field of Search ............................... 357/49, 59, 34

[56] References Cited

U.S. PATENT DOCUMENTS

| | | | |
|---|---|---|---|
| 3,381,182 | 4/1968 | Thornton | 357/49 |
| 3,407,479 | 10/1968 | Fordemwalt et al. | 357/49 |
| 3,475,664 | 10/1969 | De Vries | 357/49 |
| 3,566,214 | 2/1971 | Usuda | 357/49 |
| 3,567,508 | 3/1971 | Cox | 357/67 |
| 3,602,982 | 9/1971 | Kooi | 357/49 |
| 3,689,357 | 9/1972 | Jordan | 357/49 |
| 3,874,918 | 4/1975 | Nechtow et al. | 357/49 |
| 3,942,187 | 3/1976 | Gelsing et al. | 357/67 |
| 4,131,909 | 12/1978 | Matsuda et al. | 357/49 |

*Primary Examiner*—Gene M. Munson
*Attorney, Agent, or Firm*—Oblon, Fisher, Spivak, McClelland & Maier

[57] ABSTRACT

A semiconductor integrated circuit which includes a plurality of island regions surrounded by a bottom dish-like dielectric layer formed on one side of a support body. A transistor element is formed in the island region, and the collector region of the transistor element is formed more adjacent to one surface of the island region than the other regions. The emitter and base electrodes of the transistor element are respectively led out from the bottom side of the island region to the surface of the support body using interior leads. The method for manufacturing the above-described device is also disclosed.

5 Claims, 15 Drawing Figures

SEMICONDUCTOR INTEGRATED CIRCUIT ISOLATED THROUGH DIELECTRIC MATERIAL

CROSS-REFERENCE TO RELATED APPLICATIONS

This Application is a continuation of copending prior application Ser. No. 732,544, and bearing the same title as the subject Application and filed on Oct. 14, 1976 by Takashi Matsuda et al, and now abandoned.

BACKGROUND OF THE INVENTION

1. Field of the Invention

This invention relates generally to a semiconductor integrated circuit and more particularly to such a circuit in which an island region is electrically isolated through a dielectric layer, and to a method for manufacturing the same.

2. Description of the Prior Art

Semiconductor integrated circuits in which electrical insulation is provided between semiconductor elements using a dielectric layer are conventionally known. A plurality of semiconductor elements in the integrated circuit are arranged at a predetermined interval on one side of a semiconductor polycrystalline layer, and a dielectric or insulator separation layer is formed so as to insulate the semiconductor elements from the polycrystalline layer. Such integrated circuits are suitable for high power purposes.

However, such integrated circuits manufactured by well known prior art processes have some drawbacks, one of which is in the difficulty of manufacturing them. For example, in the process where a polycrystalline layer is formed by gas phase growth, at first the size of the polycrystalline particle is small; however, it becomes larger and larger with the advance of polycrystalline growth which causes warping of the semiconductor substrate owing to the difference in the expansion coefficient of the polycrystalline layer as a function of depth. Furthermore, warping is similarly caused due to the difference in expansion coefficient between the polycrystalline layer and the monocrystalline layer in which the semiconductor element is formed. The above-mentioned warping of the semiconductor substrate is difficult to eliminate, making the subsequent photoetching process difficult. Furthermore, with the prior art method it is very difficult to lap the polycrystalline layer to a uniform thickness.

For these reasons the prior art method, as described above, is unsuitable for manufacturing semiconductor integrated circuits. A need therefore exists for the present invention which overcomes the problems arising from the processing sequence of the prior art wherein the polycrystalline layer is grown from the gas phase.

SUMMARY OF THE INVENTION

Accordingly, one object of this invention is to provide a method for easily manufacturing a semiconductor integrated circuit including a dielectric isolating material.

Another object of this invention is to provide a semiconductor integrated circuit having an island region isolated by a dielectric material, and having a transistor element whose collector region is formed adjacent to one surface of the island region.

Yet another object of this invention is to produce a semiconductor integrated circuit without warping of the support body.

A still further object of the present invention is to provide an improved method of making a semiconductor integrated circuit.

Briefly, these and other objects are achieved according to this invention by the provision of a semiconductor substrate having island regions which are fitted to a support body by a glass adhesive plaster at low temperature. The semiconductor integrated circuit according to the invention comprises at least one bottom enclosed dielectric layer, one end of which is open at one surface of the support body forming an island region, in which a transistor element is so formed that the collector region is adjacent to one surface of the island region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
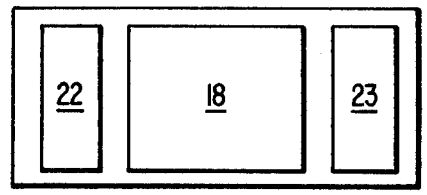
FIG. 1A is a plan view showing one embodiment of the present invention.
Figure 1B:
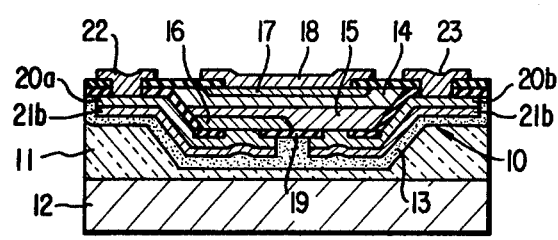
FIG. 1B is a sectional side view showing a semiconductor integrated circuit according to one embodiment of this invention.

Referring now to the drawings, wherein like reference numerals designate identical or corresponding parts throughout the several views, and more particularly to FIGS. 1A and 1B thereof, a transistor in a semiconductor integrated circuit according to this invention is shown. An island region 10 is formed in the glass layer 11 on the semiconductor substrate 12, surrounded by a dielectric layer 13 made of $SiO_2$. In this island region, a transistor having an n-type collector region 14, a p-type base region 15 and an n-type emitter region 16 is formed, in which the collector region 14 is adjacent to one surface of the support body 11, 12, having a n+-region 17 for electrical contact by collector electrode 18. The base region 15 is so formed that the base-emitter junction is flat. Furthermore, the emitter region 16 is formed at the bottom portion of the island region, and electrical contacts to the base and emitter regions are respectively made through apertures in insulating layer 19, by emitter inner or interior leads 20a, 21a and base inner or interior leads 20b, 21b in which inner or interior leads 21a, 21b are made of aluminum and inner or interior leads 20a, 20b are made of titanium respectively. These interior leads are constructed of double metal layers to insure perfect connections. It is noted that titanium combines only slightly with silicon. These inner leads are brought to the surface of the support body 11, 12 and then base electrode 23 and emitter electrode 22 are respectively connected to inner leads 20a, 21a and 20b, 21b.

Attention is now directed to FIGS. 2A to 2K, which illustrate a method of manufacturing a semiconductor integrated circuit of the above construction.

Figure 2A:
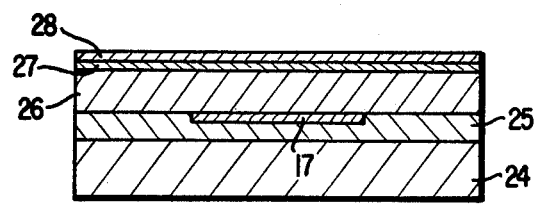
FIGS. 2A to 2K are sequential views of process steps explaining a method for manufacturing a semiconductor integrated circuit of the type shown in FIGS. 1A and 1B.

In FIG. 2A, use is made of a silicon wafer 24 the top surface of which is oriented parallel to a 100 face, the specific resistance of which is below 0.005 Ω/cm, and which has a thickness of 300 μm.

The wafer 24 has on the top surface a layer 25 of P-conductive type having a resistivity of 5 Ω/cm and a thickness of 3 μm, which is epitaxially grown using a known epitaxial vapour growth method. Subsequently, an n-conductive type high impurity concentration region 17 having a thickness of about 1 μm is formed for contact by the collector electrode by using the diffusion method. On the P-type layer 25, an n-conductive type epitaxial layer 26 having a 3 μm thickness is formed. Furthermore a thermal oxide layer 27 having 700 Å thickness and a silicon nitride film 28 having 1000 Å thickness are formed successively on the n-conductive layer 26 as masking layers, using the conventional C.V.D. (Chemical Vapour Deposition) method.

Figure 2B:
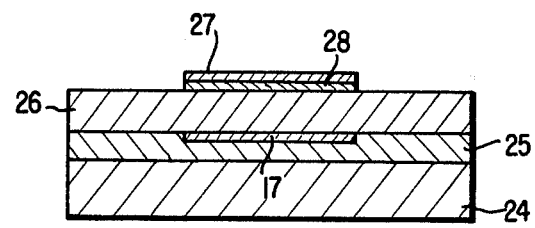

Then, as shown in FIG. 2B, selective etching is done so as to expose the n-conductive type layer 26 except for a portion where the island region is to be formed, using hydrazine as an etchant.

Figure 2C:
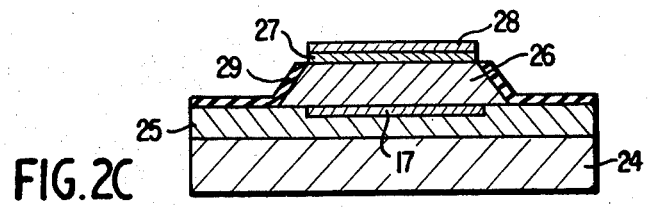
Figure 2D:
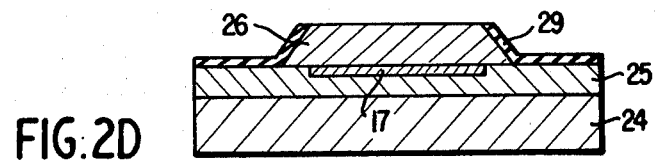

Similarly, as shown in FIG. 2C selective etching is also used to remove the layer 26 where the mask layers 27, 28 do not cover it, and a thermal oxide layer 29 having a 6000 Å thickness is grown over the surface of the epitaxial layer except where the masking layers 27, 28 are provided. Subsequently as shown in FIG. 2D the masking layers are removed. For instance, the silicon nitride film 28 may be removed by etching methods, and the thermal oxide layer 27 may be etched away by ammonium fluoride. In this process thermal oxide layer 27 is not entirely removed because the thickness of the layer 29 is 1 μm, while on the other hand that of the thermal oxide layer 27 is 1000 Å.

Figure 2E:
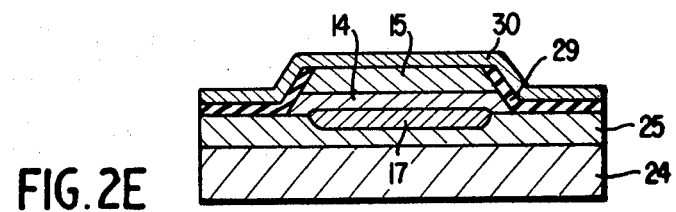
Figure 2F:
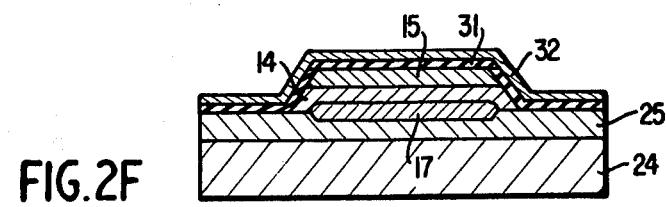
Figure 2G:
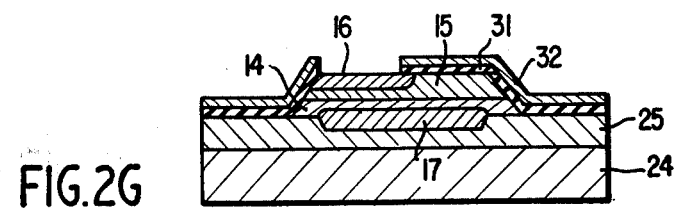
Figure 2H:
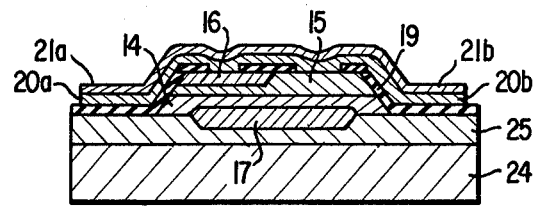

As shown in FIG. 2E, doped oxide layer 30, including boron as an impurity, is grown on the exposed surface and the thermal oxide layer 20, and P-conductive type base region 15 having 3000 Å thickness is formed using the diffusion method so as to form a flat collector-base junction. In this diffusion process, the n+ layer 17 migrates slightly into both the layer 25 and the layer 14. Subsequently as shown in FIG. 2F, after removing the doped oxide layer 30, masking layers such as thermal oxide layer 31 having a 700 Å thickness, and silicon nitride film 32, having a 1500 Å thickness, are formed on the surface of the epitaxial layer using the C.V.D. method. Portions of such masking layers are removed where the emitter region is to be formed and the emitter region is formed by diffusing phosphorous as shown in FIG. 2G. After removing all of the masking layers, as shown in FIG. 2H, thermal oxide layer 19 is formed on the epitaxial layer, having a 1000 Å thickness, the two portions of the thermal oxide layer 19 are apertured so as to expose portions of base region 15 and emitter region 16 for electrode contact. Then titanium layers 20a, 20b, each having a 1000 Å thickness, and aluminum layers 21a, 21b, each having a 6000 Å thickness, are evaporated on the thermal oxide layer 19 and the exposed portions of the underlying regions. These metal layers are selectively etched to form emitter and base interior leads, which provide a means for leading out the base and emitter electrodes.

Figure 2I:
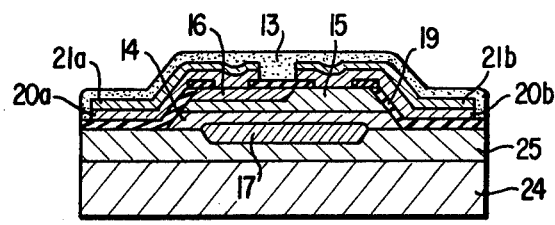
Figure 2J:
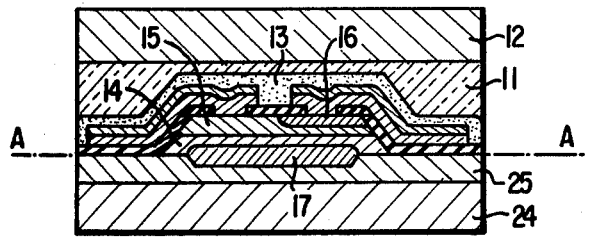
Figure 2K:
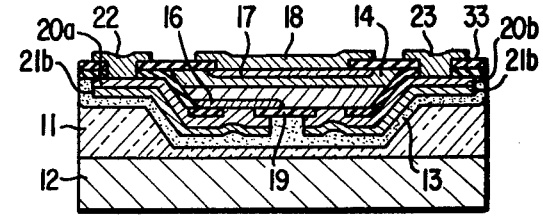

Subsequently, as shown in FIG. 2I, thermal oxide layer 13, having a 3000 Å thickness, is grown at a temperature of 480° C. on all surfaces of the island region. Then, as shown in FIG. 2J, the semiconductor substrate having the above-mentioned island region is fitted to another semiconductor substrate 12 using PbO-SiO₂ system glass 11 as an adhesive plaster, the expansion coefficient of which is about equal to that of the monocrystalline silicon substrate's, at a low temperature of 500° C., at which warping of the substrate cannot occur.

Figure 3:
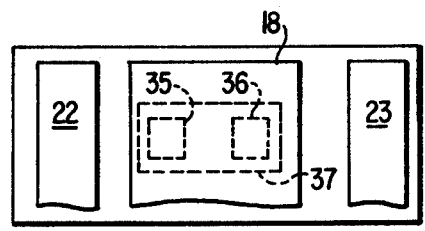
FIG. 3 is a plan view showing the electrodes of a transistor of the type shown in FIG. 2K; and, FIG. 4 is a sectional side view showing a semiconductor integrated circuit according to another embodiment of this invention.

Then, substrate 24 and epitaxial layer 25 are etched away using suitable etchants down to line A—A. First, the substrate 24 is etched using an etchant consisting of HF, HNO₃ and CH₃COOH. Second, epitaxial layer 25 is etched using hydrozine. On the etched surface of the island region, a thermal oxide layer 33 is formed and collector, emitter and base electrode contact portions of the thermal oxide layers 19, 33 are apertured. To aperture the layers for base and emitter electrode contacts, use is made of an etchant which does not etch titanium metal. Subsequently, an aluminum metal layer is evaporated on the thermal oxide layer and on the electrode contact portions of the transistor. The metal layer is also selectively etched to form emitter electrode 22, base electrode 23 and collector electrode 18. FIG. 3 is a plan view of a semiconductor integrated circuit of the type shown in FIG. 2K. The numerals 22, 23 and 18 identify, respectively, emitter, base and collector electrodes made of aluminum metal, while 35, 36 and 37 shown in dashed lines, are apertures from which the electrodes are led out.

Figure 4:
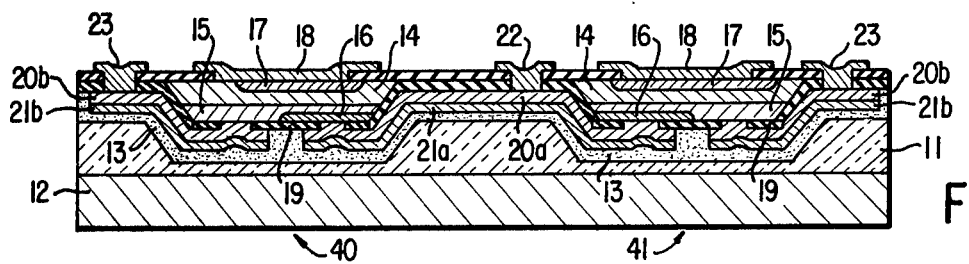

FIG. 4 shows another embodiment according to this invention. In this embodiment, emitter interior leads 20a, 21a of adjacent transistors 40, 41 are connected mutually in the support body. This embodiment is used when connecting the emitter electrodes of two or more transistor circuits.

In summary, this invention provides several advantages over the prior art. Among these advantages are first, warping of the support body does not occur because a semiconductor substrate including an island region is fitted to another substrate at a low temperature. Second, in forming the base region, diffusion from all surfaces of the substrate make it possible to form a flat collector-base junction, so that the breakdown voltage $V_{CBO}$ between collector and base is high. Third, the method according to this invention does not require a lapping process, therefore manufacturing of the semiconductor integrated circuit is both easy and accurate. Lastly, in constructing some circuits according to this invention, a smaller chip size is possible because interior leads are used for connection between adjacent island regions in the support body.

Although this invention has been disclosed and illustrated with reference to particular applications, the principles involved ae susceptible of numerous other applications which will be apparent to those skilled in the art. The invention is, therefore, to be limited only as indicated by the scope of the appended claims.

What is claimed as new and desired to be secured by Letters Patent of the United States is:

1. A semiconductor integrated circuit comprising:
   a support body comprised of at least three diverse and adjacent layers; said support body including a layer of semiconductor substrate material; a layer of glass with a concave region located on one side of said layer of glass and with the other side of said layer of glass being substantially planar with said adjacent layer of semiconductor substrate; and a layer of dielectric material located adjacent the one side of said layer of glass that conforms substantially to the concave region located in said layer of glass; said layer of dielectric material having a center section of greater thickness that the remainder of said layer and extending outwardly from said support body;

first and second electrode structures located adjacent said layer of dielectric material and being electrically isolated from each other by the center section of said layer of dielectric material and conforming to the concave shape of said layer of dielectric material;

an insulating layer located adjacent said first and second electrode structures for electrically isolating said first and second electrode structures from a transistor element; said insulating layer having an aperture therein for each of said first and second electrode structures to thereby establish electrical connection to said transistor element through said first and second electrode structures; said transistor element being comprised of a semiconductor material having: a base region being of one conductivity type electrically connected to said first electrode of the electrode structures; an emitter region of another conductivity type formed in an area of said base region adjacent said second electrode of the electrode structures; and a collector region located adjacent said base region and electrically isolated from said first and second electrode structures by said base region and said insulating layer; said collector region forming the surface layer of said semiconductor integrated circuit; and at least three surface electrodes electrically isolated from each other by a surface portion of said insulating layer and with at least one of the three surface electrodes being in contact with each of said collector region and said first and second electrode structures; said surface electrodes being in contact with said first and second electrodes through apertures provided within the surface portion of said insulating layer at the surface of said transistor element.

2. A semiconductor integrated circuit as in claim 1 wherein the collector region located adjacent the base region forms a flat collector-base junction.

3. A semiconductor integrated circuit as in claim 1 wherein:
said first and second electrode structures are made of double layers of titanium and aluminum metals.

4. A semiconductor integrated circuit as in claim 1 wherein:
said glass layer consists of a $PbO\text{-}SiO_2$ system, the expansion coefficient of which is about equal to that of monocrystalline silicon.

5. A semiconductor integrated circuit comprising:
a support body comprised of at least three diverse and adjacent layers; said support body including a layer of semiconductor substrate material; a layer of glass with at least two concave regions located on one side of said layer of glass and with the other side of said layer of glass being substantially planar with said adjacent layer of semiconductor substrate; and a layer of dielectric material located adjacent the one side of said layer of glass that conforms substantially to the concave regions located in said layer of glass; said layer of dielectric material in each of said at least two concave regions having a center section of greater thickness than the remainder of said layer and extending outwardly from said support body;

first, second and third electrode structures located adjacent said layer of dielectric material and being electrically isolated from each other by the center sections of said layer of dielectric material and conforming to the concave shape of said layer of dielectric material;

an insulating layer located adjacent said first, second and third electrode structures for electrically isolating said first, second and third electrode structures from at least two transistor elements; said insulating layer having an aperture therein for each of said first, second and third electrode structures to thereby establish electrical connection to said at least two transistor elements through said first, second and third electrode structures; each of said at least two transistor elements being comprised of a semiconductor material having: a base region of one conductivity type, said base regions in said at least two transistor elements being electrically connected to said first electrode and said third electrode of the electrode structures; an emitter region of another conductivity type formed in an area of said base region, in each of said at least two transistor elements, adjacent said second electrode of the electrode structures, said second electrode connecting the emitter regions in both of said at least two transistor elements to each other; and a collector region located adjacent said base region in each of said at least two transistor elements and electrically isolated from said first, second and third electrode structures by said base regions and said insulating layer; said collector regions forming the surface layer of said semiconductor integrated circuit; and at least five surface electrodes electrically isolated from each other by a surface portion of said insulating layer and with at least one of the five surface electrodes being in contact with each of said collector regions and said first, second and third electrode structures; said surface electrodes being in contact with said first, second and third electrodes through apertures provided within the surface portion of said insulating layer at the surface of said transistor elements.

* * * * *